United States Patent
Chen et al.

(10) Patent No.: US 11,474,152 B2
(45) Date of Patent: Oct. 18, 2022

(54) MOTOR FAULT DETECTION SYSTEM BASED ON COUPLING INJECTION OF HIGH FREQUENCY SIGNALS

(71) Applicant: TIANGONG UNIVERSITY, Tianjin (CN)

(72) Inventors: Wei Chen, Tianjin (CN); Shuhai Dong, Tianjin (CN); Xinmin Li, Tianjin (CN); Tingna Shi, Tianjin (CN); Changliang Xia, Tianjin (CN)

(73) Assignee: TIANGONG UNIVERSITY, Tianjin (CN)

( * ) Notice: Subject to any disclaimer, the term of this patent is extended or adjusted under 35 U.S.C. 154(b) by 431 days.

(21) Appl. No.: 16/729,437

(22) Filed: Dec. 29, 2019

(65) Prior Publication Data
US 2021/0132150 A1 May 6, 2021

(30) Foreign Application Priority Data
Nov. 6, 2019 (CN) .......................... 201911078380X

(51) Int. Cl.
*H02P 27/04* (2016.01)
*G01R 31/34* (2020.01)
*H02K 11/26* (2016.01)
*H02K 11/27* (2016.01)

(52) U.S. Cl.
CPC .......... *G01R 31/343* (2013.01); *H02K 11/26* (2016.01); *H02K 11/27* (2016.01)

(58) Field of Classification Search
CPC ........ H02P 21/22; H02P 6/183; H02P 29/032; H02P 27/06; G01R 31/343; H02K 11/26; H02K 11/27
See application file for complete search history.

(56) References Cited

U.S. PATENT DOCUMENTS

| | | | | |
|---|---|---|---|---|
| 8,405,339 B2 * | 3/2013 | Zhang | ................. | G01R 31/343 700/286 |
| 8,593,150 B2 * | 11/2013 | Vrankovic | ............. | G01R 31/52 324/509 |

FOREIGN PATENT DOCUMENTS

CN          113381657 A  *  9/2021

* cited by examiner

*Primary Examiner* — Karen Masih
(74) *Attorney, Agent, or Firm* — Dragon Sun Law Firm, PC; Jinggao Li; Nathaniel Perkins

(57) ABSTRACT

A motor fault detection system is based on coupling injection of high-frequency signal. An input end of the motor is connected with the high-frequency detection signal source circuit through the coupling circuit to inject a high-frequency detection signal into the motor winding; an input end of the high-frequency detection signal source circuit is connected with an output end of the controller to control the output of the high-frequency detection signal; an output end of the response signal processing circuit is connected with an input end of the controller to send the received voltage or current response signal to the controller; and the controller judges whether the motor has a fault and the degree of the fault by analyzing the response signal after applying an excitation.

8 Claims, 5 Drawing Sheets

MOTOR FAULT DETECTION SYSTEM BASED ON COUPLING INJECTION OF HIGH FREQUENCY SIGNALS

CROSS-REFERENCE TO RELATED PATENT APPLICATION

This application claims priority to and the benefit of CN 201911078380X, filed Nov. 6, 2019, entitled "MOTOR FAULT DETECTION SYSTEM BASED ON COUPLING INJECTION OF HIGH FREQUENCY SIGNALS," by Wei CHEN et al. The entire disclosure of the above-identified application is incorporated herein by reference.

Some references, which may include patents, patent applications, and various publications, are cited and discussed in the description of the present invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference

FIELD OF THE INVENTION

The invention relates to a motor fault detection system, in particular to a motor fault detection system based on coupling injection of high frequency signal.

BACKGROUND OF THE INVENTION

As an important power equipment, a motor is widely used in petroleum industry, aerospace, household appliances, rail transit and other fields. Once the motor breaks down, it will cause shutdown, bring great economic loss, even endanger production safety.

In order to avoid the motor failure, in practical application, the motor often needs to be maintained regularly, so that an off-line fault detection is required. But the off-line fault detection method has defects such as a long detection period and poor real-time performance. With the urgent need of safety production and the development of science and technology, the technology that can perform on-site detection of motor faults, and even provide advanced warning has attracted the attention of the industry.

Common faults of motor include stator winding fault, stator core fault, rotor fault, air gap eccentric fault, demagnetization of permanent magnet, bearing fault, locked rotor fault, etc. Motor stator winding fault mainly includes insulation breakdown between layers and turns, stator winding grounding and open circuit of stator winding. The stator core faults mainly are short circuit and core loosening. The operation of the motor rotor bears a great amount of pressure. Under the long-term action of this pressure, it is easy to cause rotor faults such as bar breaking, end ring open welding, winding breakdown, imbalance, etc. Most of these faults are accompanied by the changes of the internal voltage, current, potential, flux, inductance, resistance, reactance and other parameters of the motor. The real-time detection of the motor parameters is of great significance for the on-site detection and early warning of faults.

High-frequency detection signal injection is an effective on-site detection method for motor fault, which uses an inverter to inject high-frequency detection signal into motor winding, and the high-frequency signal generates corresponding high-frequency current or voltage response in the motor winding. If the motor fails, the equivalent model of the motor winding will produce asymmetry, so that the high-frequency current or voltage response will be changed. Therefore, it is possible to detect the high-frequency current or voltage response to determine whether the motor is in fault. However, the high-frequency detection signal of the existing method is injected by the inverter, and the detection accuracy is limited by the switching frequency of the inverter and its nonlinear characteristics, which may lead to misjudgment of the motor fault.

Therefore, a heretofore unaddressed need exists in the art to address the aforementioned deficiencies and inadequacies.

SUMMARY OF THE INVENTION

The objectives of the present invention are to provide a motor fault detection system based on coupling injection of high-frequency signal, which can realize on-site fault detection without affecting the normal operation of the motor.

The technical scheme adopted by the present invention is as follows: a motor fault detection system based on coupling injection of high-frequency signal, including a power supply, an inverter, a motor, a coupling circuit, a high-frequency detection signal source circuit, a response signal processing circuit and a controller. The input end of the motor is connected with the power supply through the inverter, and the input end of the motor is connected with the high-frequency detection signal source circuit through the coupling circuit to inject high-frequency detection signal into the motor winding. The input end of the high-frequency detection signal source circuit is connected with an output end of the controller to control the output of the high-frequency detection signal, and an output end of the response signal processing circuit is connected with an signal input end of the controller to send the received motor winding voltage or current response signal to the controller. The controller judges whether the motor has a fault and the degree of the fault by analyzing the response signal after applying an excitation.

An input end of the response signal processing circuit is directly connected to the power input end of the motor to obtain the motor winding voltage or current response signal. Alternatively, the input end of the response signal processing circuit is connected with the power input end of the motor through the coupling circuit to obtain the motor winding voltage or current response signal.

The output end of the inverter is connected with the input end of the motor through a high-frequency signal wave arrester.

The high-frequency signal wave arrester is composed of an inductor $L_1$ and a capacitor $C_1$ in parallel.

The high-frequency detection signal source circuit includes a signal source chip, for generating high-frequency detection signals, and a switch tube. The gate of the switch tube is the input end, which is connected with the output end of the controller, the source of the switch tube is connected with the input end of the signal source chip through a diode $D_1$, and the output end of the signal source chip is connected with the input end of the coupling circuit.

The response signal processing circuit comprises a resistance $R_1$, a resistance $R_2$ and a resistance $R_3$. One end of the resistances $R_1$, $R_2$ and $R_3$ are grounded, and the other end thereof are connected to the input end of the motor through capacitors $C_4$, $C_5$ and $C_6$, respectively. Then, three high-frequency output ends, which are respectively led out between the resistance $R_1$ and the capacitor $C_4$, between the resistance $R_2$ and the capacitor $C_5$, and between the resistance $R_3$ and the capacitor $C_6$, are connected with the input end of the controller, respectively.

The controller judges whether the motor has a fault and the degree of the fault by analyzing the asymmetry, harmonic component, sudden change, fluctuation range of parameters, such as voltage, current, potential, flux, inductance, resistance, reactance.

The controller judges whether the motor has a fault and the degree of the fault by analyzing the result of a negative sequence component of high-frequency current signal. When an inter-turn short circuit fault occurs in the motor winding, the equivalent model of the motor winding is asymmetric, and the high-frequency current response of the stator winding is composed of a positive sequence component and the negative sequence component, which is expressed as follows:

$$i_{hf}^s = i_{hf\_p}^s + i_{hf\_n}^s$$

Where $i_{hf}^s$ is a high-frequency current response of the stator winding; $i_{hf\_p}^s$ and $i_{hf\_n}^s$ are a positive sequence component and a negative sequence component of the high-frequency current response, respectively;

Wherein, the negative sequence component includes asymmetric information of the winding equivalent model. When the winding equivalent model is asymmetric, the negative sequence component is not equal to zero, that is to say, when the detected negative sequence component of the high-frequency current is not equal to zero, it is determined that the equivalent model is asymmetric, and it is further determined that an inter-turn short circuit fault has occurred in the motor winding. At the same time, the magnitude of the negative sequence component of the high-frequency current response is in direct proportion to the degree of the fault.

The motor fault detection system based on coupling injection of high-frequency signal of the present invention can be applied to motors with different power levels and different rated parameters due to not rely on the parameters of motor, and it realizes real-time detection of motor faults, overcoming the disadvantage of slow response to faults in off-line detection. Meanwhile, the present invention does not depend on the inverter and avoids the impact of the inverter itself on the detection accuracy of the high-frequency detection signal. The beneficial effects of the present invention are as follows:

1. By injecting high-frequency detection signal into the motor winding and using response signal processing circuit to obtain the high-frequency voltage or current response of the motor winding, the present invention can judge whether the motor has a fault and the degree of the fault through the result of response.

2. The present invention adopts an independent signal source to generate a high-frequency detection signal which frequency is far higher than the frequency of the motor driving voltage. Through frequency division multiplexing of motor winding, high-frequency detection signal and driving voltage do not interfere with each other, the high-frequency detection signal is used for on-site detection of motor faults, and the drive voltage with low frequency is used for controlling the motor.

3. The present invention overcomes the defects of the traditional off-line fault detection, realizes on-site fault detection instead of interrupting the normal operation of the motor, that is the motor does not need to stop operating, and expands the application scope of the method.

4. The present invention does not depend on the parameters of motor, so it is applicable to motors with different power levels and different rated parameters.

BRIEF DESCRIPTION OF THE DRAWINGS

The accompanying drawings illustrate one or more embodiments of the present invention and, together with the written description, serve to explain the principles of the invention. Wherever possible, the same reference numbers are used throughout the drawings to refer to the same or like elements of an embodiment.

Figure 1:
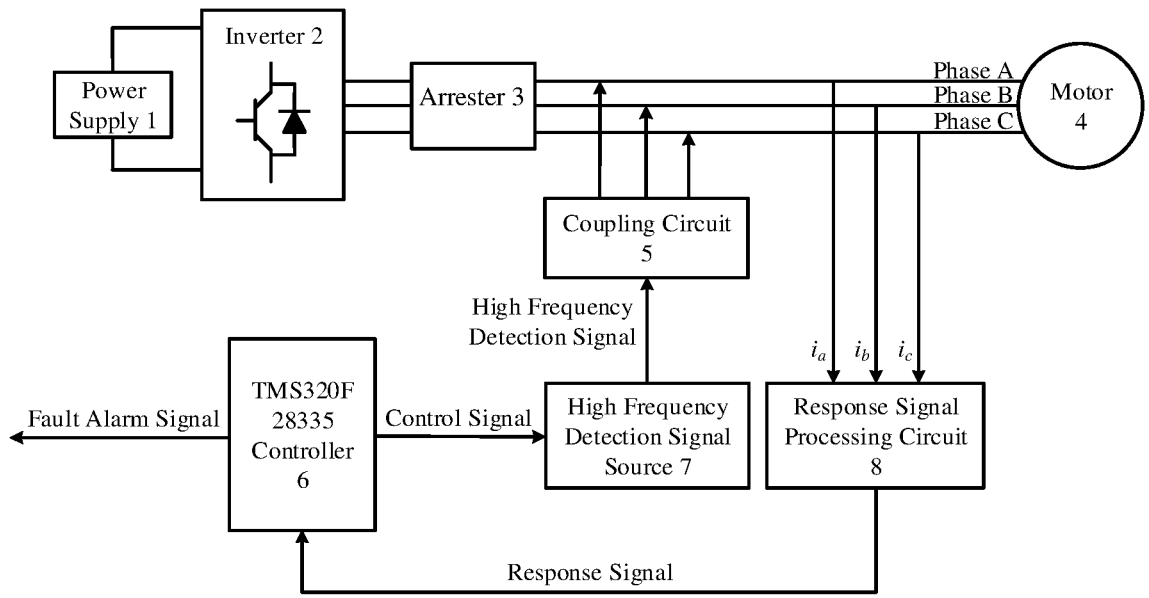
FIG. 1 is a block diagram of an embodiment 1 of a motor fault detection system according to the present invention.

Wherein:
1: Power supply 2: Inverter
3: High-frequency signal wave arrester 4: Motor
5: Coupling circuit 6: Controller
7: High-frequency detection signal source circuit
8: Response signal processing circuit.

DETAILED DESCRIPTION OF THE EMBODIMENTS

The present invention will now be described more fully hereinafter with reference to the accompanying drawings, in which exemplary embodiments of the present invention are shown. The present invention may, however, be embodied in many different forms and should not be construed as limited to the embodiments set forth herein. Rather, these embodiments are provided so that this disclosure is thorough and complete, and will fully convey the scope of the invention to those skilled in the art. Like reference numerals refer to like elements throughout.

The present invention will be described in detail below with reference to the drawings in conjunction with the embodiments.

The present invention relates to a motor fault detection system based on coupling injection of high-frequency signal, which generates a high-frequency detection signal through an independent signal source, and the high-frequency detection signal and a driving voltage output by the inverter are simultaneously injected into the motor winding through the coupling circuit. Through frequency division multiplexing of motor winding, high-frequency detection signal and the driving voltage do not interfere with each other. The high-frequency detection signal is used for on-site detection of motor faults, and the low-frequency drive voltage is used for controlling the motor. The high-frequency current or voltage response is obtained by the signal processing circuit. In practical applications, the mode of signal generation, the waveform of high-frequency signal, the method of injection and the acquisition mode of high-frequency current or voltage response may vary according to the requirements and conditions, and these deformations and applications shall all belong to the protection scope of the present invention.

Figure 2:
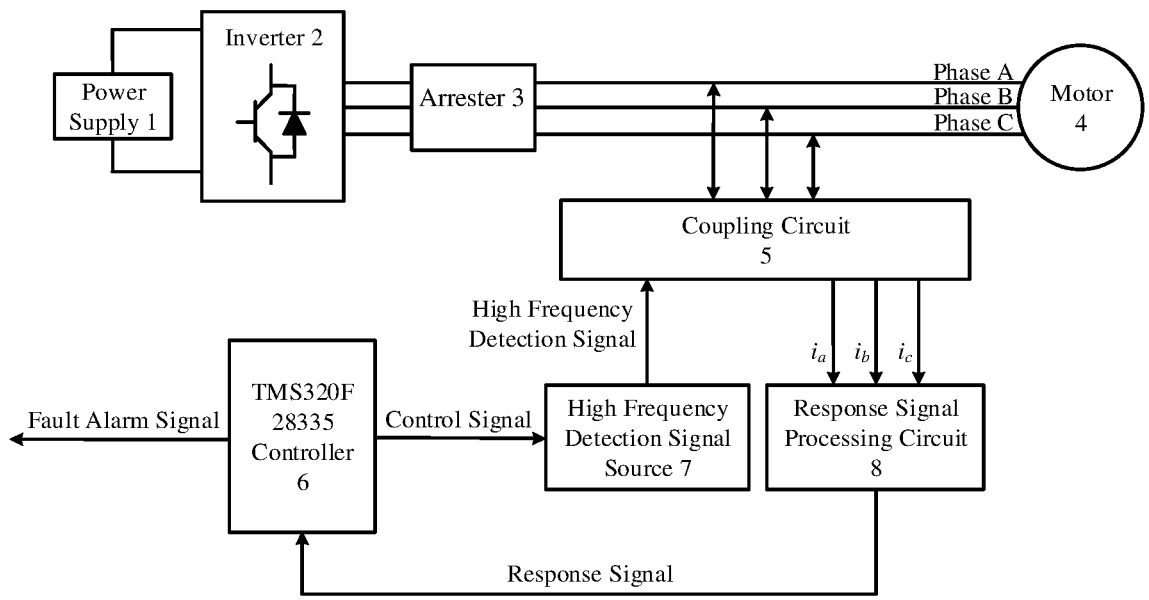
FIG. 2 is a block diagram of an embodiment 2 of a motor fault detection system according to the present invention.

As shown in FIG. 1 and FIG. 2, a motor fault detection system based on coupling injection of high-frequency signal includes a power supply 1, an inverter 2, a motor 4, a coupling circuit 5, a high-frequency detection signal source circuit 7, a response signal processing circuit 8 and a controller 6. An input end of the motor 4 is connected to the power supply 1 through the inverter 2. The input end of the motor 4 is connected with the high-frequency detection signal source circuit 7 through the coupling circuit 5 to inject the high-frequency detection signal into the motor winding. An input end of the high-frequency detection signal source circuit 7 is connected with an output end of the controller 6 to control the output of the high-frequency detection signal. An output end of the response signal processing circuit 8 is connected with an input end of the controller 6 to send the received voltage or current response signal to the controller 6. An input end of the response signal processing circuit 8 can be directly connected to the power input end of the motor 4 to obtain the motor winding voltage or current response signal. Alternatively, the input end of the response signal processing circuit 8 can be connected with the power input end of the motor 4 through the coupling circuit 5 to obtain the motor winding voltage or current response signal. The controller 6 judges whether the motor has a fault and the degree of the fault by analyzing the response signal after applying an excitation. The controller 6 in the embodiment is a controller based on TMS320F28335.

The high-frequency signal wave arrester 3 can prevent the high-frequency signal from entering the inverter side, and can make the high-frequency detection signal not affected by the power grid or the inverter 2.

Figure 3:
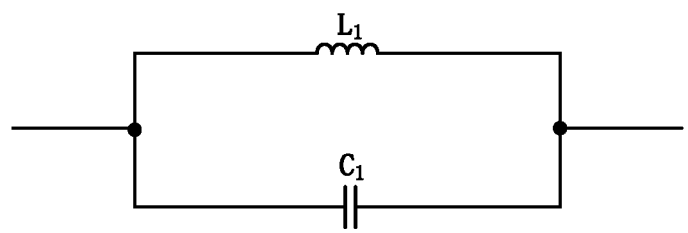
FIG. 3 is a schematic diagram of the high-frequency signal wave arrester in the present invention.

In the embodiment of the present invention, an output end of the inverter 2 is connected with the input end of the motor 4 through the high-frequency signal wave arrester 3, as shown in FIG. 3, and the high-frequency signal wave arrester 3 is composed of an inductance $L_1$ and a capacitor $C_1$ in parallel. The high-frequency signal wave arrester 3 has a low impedance to low-frequency signal and a large impedance to the high-frequency signal. By presetting the parameters, the high-frequency signal wave arrester can prevent the high-frequency signals used for detection by driving the low-frequency voltage of the motor, while not affecting the operation of the motor, and avoiding the impacts of the inverter, a power switch and grid voltage fluctuations on high-frequency signal detection. The reasonably set high-frequency signal wave arrester can also filter the PWM modulation signal only by the driving voltage of the motor's operating frequency, so that the internal loss of the motor is reduced and running performance is improved. Existing active or passive sine wave filters used by some motors to suppress the effects of PWM modulation signals sent by inverters on motors can also function as wave arresters.

The injection system of high-frequency detection signal is composed of the signal source and the coupling circuit. The controller 6 controls the independent high-frequency detection signal source circuit 7 to send out the high-frequency detection signal which is then injected into the motor winding through the coupling circuit 5 to on-site detect the motor fault. The invention does not need to inject detection signal through an inverter, so that the limitation of switching frequency of the inverter and its nonlinear characteristics are avoided.

Figure 4:
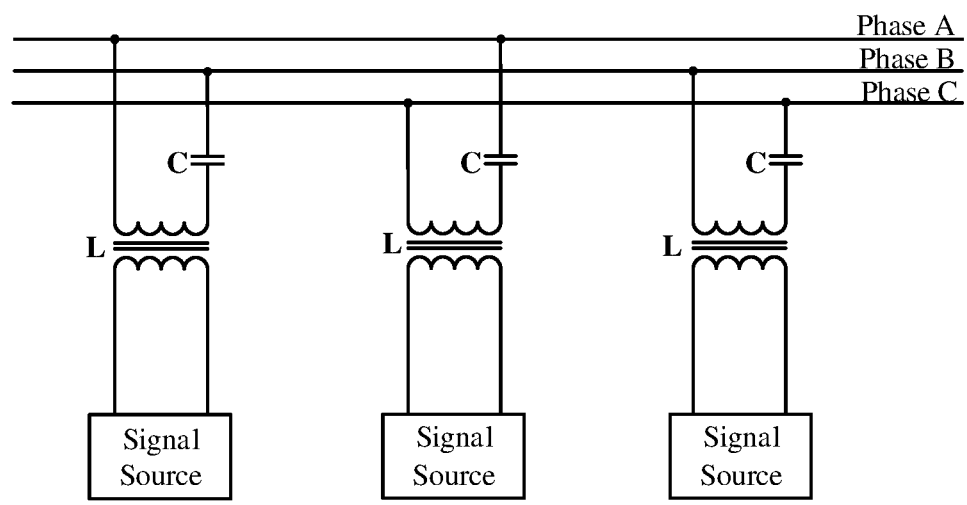
FIG. 4 is a schematic diagram of the coupling circuit in the present invention.

As shown in FIG. 4, the coupling circuit 5 is composed of three coupling units with the same structure, and each coupling unit includes a transformer L. The primary coil of the transformer L is connected with the output end of the high-frequency detection signal source circuit 7, and one end of the secondary coil of the transformer L is connected with the input end of the motor 4, and the other end of the secondary coil is connected with the input end of the motor 4 through a capacitor C. The coupling circuit is used for injecting the high-frequency detection signal into the motor winding, so as to replace the traditional way of injecting the detection signal by an inverter. The high-frequency detection signal generated by the signal source is injected into the motor winding through the transformer, and the capacitor C prevents the low-frequency drive voltage output by the inverter from entering the signal source circuit. In addition to the above circuits, other coupling circuits such as capacitive coupling circuit and inductive coupling circuit can also be used.

Figure 5:
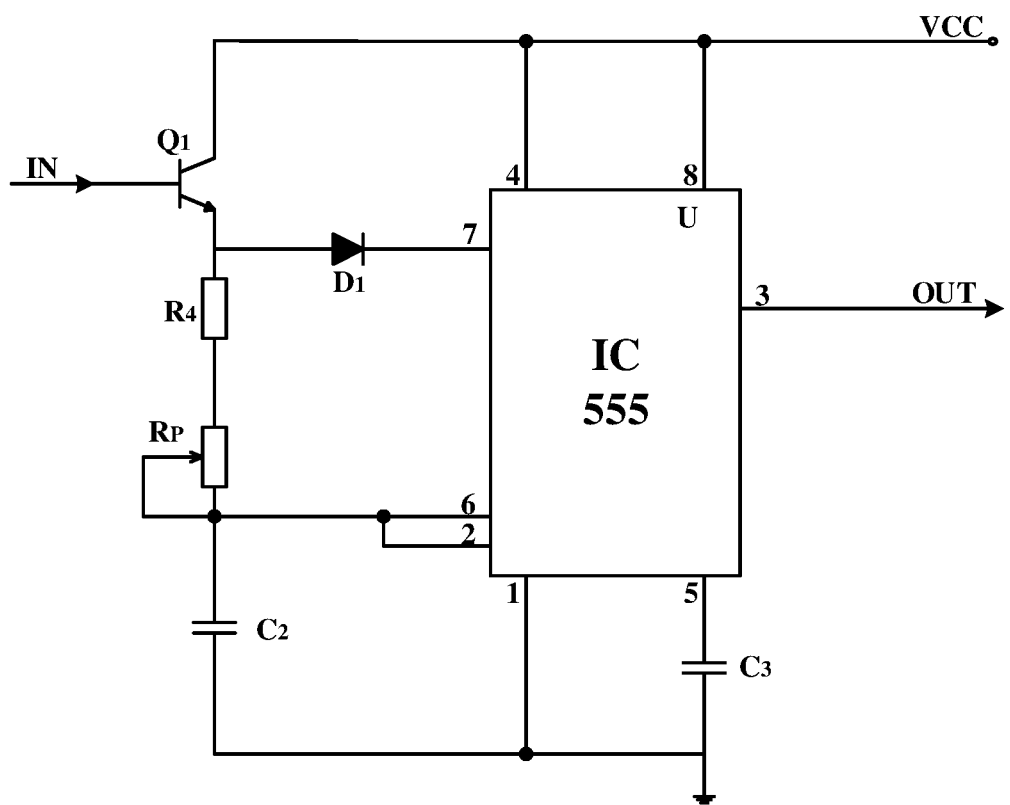
FIG. 5 is a schematic diagram of the embodiment 1 of a high-frequency detection signal source circuit of in the present invention.
Figure 6:
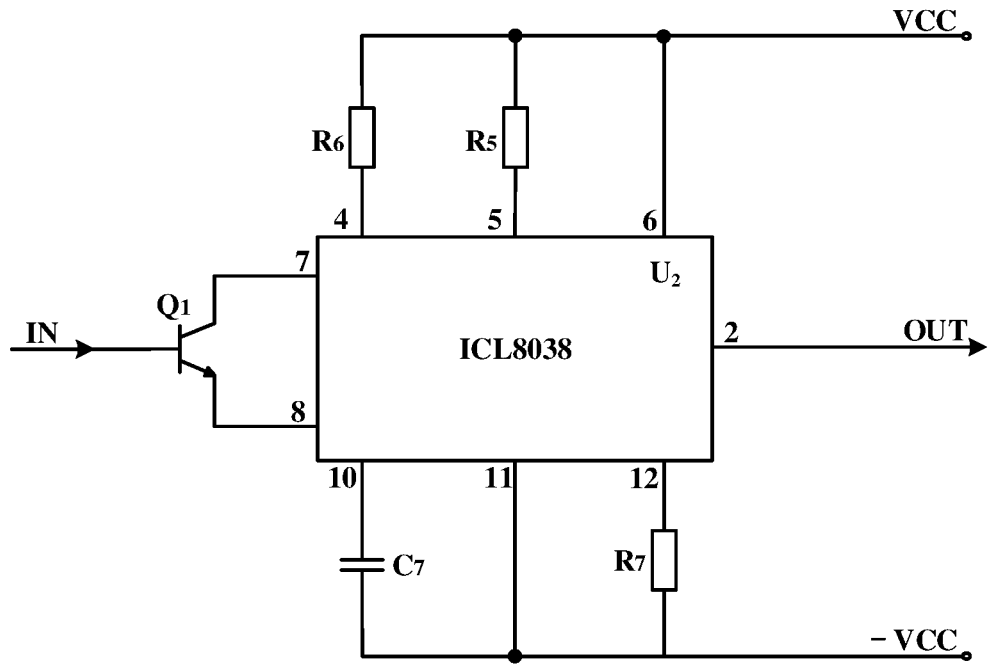
FIG. 6 is a schematic diagram of the embodiment 2 of a high-frequency detection signal source circuit of in the present invention.

As shown in FIG. 5 and FIG. 6, the high-frequency detection signal source circuit 7 of the present invention includes: a signal source chip U and a switch tube $Q_1$, the gate of the switch tube $Q_1$ is the input end which is connected to the output end of the controller 6, the source of the switch tube $Q_1$ is connected to an input end of the signal source chip U through a diode $D_1$, the high-frequency detection signal output end of the signal source chip U is connected to an input end of the coupling circuit 5. The frequency of the high-frequency detection signal output from the high-frequency detection signal source circuit 7 is normally higher than the operating frequency of the motor output from the inverter 2, so that the detection signal and the driving signal can be distinguished from each other by frequency. Through frequency division multiplexing of motor winding, the high-frequency detection signal is used for on-site detection of motor faults, and the drive voltage with low frequency is used for controlling the motor.

As shown in FIG. 5, the high-frequency detection signal source circuit 7 includes: the signal source chip U and the switch tube $Q_1$. A pin 4 and a pin 8 of the input end of the signal source chip U are connected to the power supply VCC, a pin 1 of the grounding end is directly grounded, a pin 5 is grounded through a capacitor $C_3$. The gate of the switch tube $Q_1$ is the input end which is connected to the output end of the controller 6, and the drain of the switch tube $Q_1$ is connected to the power supply VCC. The source of the switch tube $Q_1$ is connected to a pin 7 through the diode $D_1$, meanwhile, the source is grounded through a resistor $R_4$, an adjustable resistor $R_P$ and a capacitor $C_2$ successively. The adjusting end of the adjustable resistor $R_P$ is connected with a pin 2 and a pin 6, and a pin 3 of the output end of the signal source chip U is connected with the coupling circuit 5. In the embodiment of the present invention, the signal source chip U adopts the chip IC555. If other chips are used to generate high-frequency signals, the pin definitions may be different. The high-frequency detection signal source circuit 7 can generate sine wave signal with frequency $f=1/[1.278(R_4+R_P)C_2]$, and the frequency can be changed by adjusting the parameters of resistance and capacitance.

As shown in FIG. 6, another scheme of the high-frequency detection signal source circuit 7 includes: a signal source chip $U_2$ and a switch tube $Q_2$. A pin 6 of the input end of the signal source chip $U_2$ is connected with the power supply VCC, and a pin 5 and a pin 4 of the input end of the signal source chip $U_2$ are respectively connected with the power supply VCC through a resistance $R_5$ and a resistance $R_6$. A pin 11 of the input end of the signal source chip $U_2$ is connected with the power supply −VCC, and a pin 10 and a pin 12 are connected with the power supply −VCC through a capacitor $C_7$ and a resistance $R_7$, respectively. The gate of the switch tube $Q_2$ as the input end of the switch tube $Q_2$ is connected to the output end of the controller 6, and the drain and source of the switch tube $Q_2$ are connected with a pin 7 and a pin 8 of the signal source chip $U_2$ respectively. The high-frequency detection signal source circuit 7 can generate sine wave signal with frequency $f=0.33/R_5C_7$, and the frequency can be changed by adjusting the parameters of the resistance and the capacitor.

Figure 7:
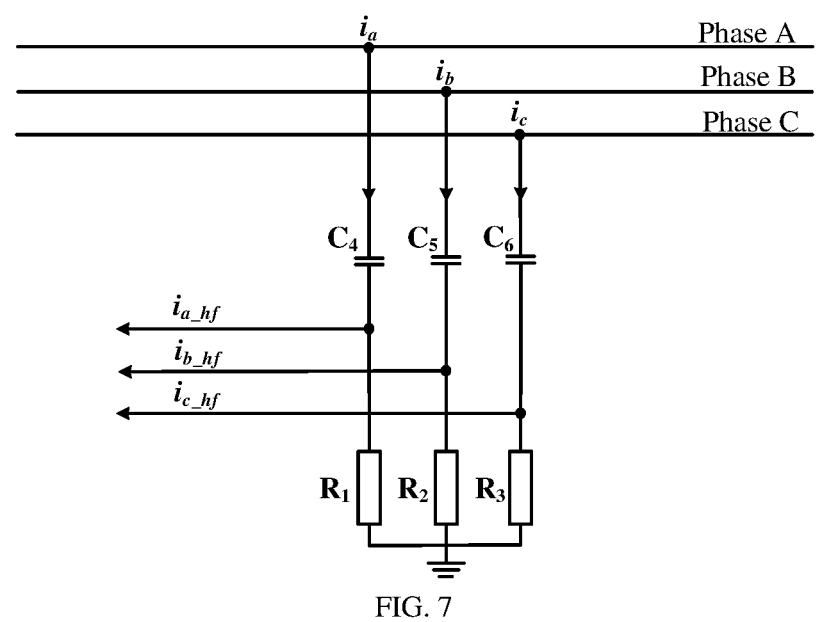
FIG. 7 is a schematic diagram of the response signal processing circuit in the present invention.

The response signal processing circuit 8 is used for extracting the high-frequency voltage or current signal from the voltage or current signal of the motor winding, generally including a high pass filter to filter out the interference of the low-frequency signal. As shown in FIG. 7, the response signal processing circuit 8 comprises a resistance $R_1$, a resistance $R_2$ and a resistance $R_3$. One end of the resistances $R_1$, $R_2$ and $R_3$ are grounded, and the other end thereof are connected to the input ends $i_a$, $i_b$, $i_c$ of the motor 4 through capacitors $C_4$, $C_5$ and $C_6$ respectively. Then, three high frequency output ends $i_{a\_hf}$, $i_{b\_hf}$ and $i_{c\_hf}$, which are respectively led out between the resistance $R_1$ and the capacitor $C_4$, between the resistance $R_2$ and the capacitor $C_5$, and between the resistance $R_3$ and the capacitor $C_6$, are connected with the input end of the controller.

For the common faults of motor such as stator fault, rotor fault, demagnetization of permanent magnet, air gap eccentric fault, bearing fault, locked rotor fault, etc., the controller 6 can judge whether the motor has a fault and the degree of the fault by analyzing the asymmetry, harmonic component, sudden change, fluctuation range of parameters, such as voltage, current, potential, flux, inductance, resistance, reactance.

Taking the common inter-turn short circuit fault of stator winding as an example, in the motor fault detection system based on coupling injection of high-frequency signal according to the present invention, the controller 6 judges whether the motor has a fault and the degree of the fault by analyzing the result of a negative sequence component of high-frequency current signal. When an inter-turn short circuit fault occurs in the motor winding, the equivalent model of the motor winding is asymmetric, and the high-frequency current response of the stator winding is composed of a positive sequence component and the negative sequence component, which is expressed as follows:

$$i_{hf}^s = i_{hf\_p}^s + i_{hf\_n}^s$$

Where $i_{hf}^s$ is the high-frequency current response of the stator winding; $i_{hf\_p}^s$ and $i_{hf\_n}^s$ are the positive sequence component and the negative sequence component of the high-frequency current response respectively;

Wherein, the negative sequence component includes asymmetric information of the winding equivalent model. When the winding equivalent model is asymmetric, the negative sequence component is not equal to zero, that is to say, when the detected negative sequence component of the high-frequency current is not equal to zero, it is determined that the equivalent model is asymmetric, and it is further determined that an inter-turn short circuit fault has occurred in the motor winding. At the same time, the magnitude of the negative sequence component of the high-frequency current response is in direct proportion to the degree of the fault.

Figure 8A:
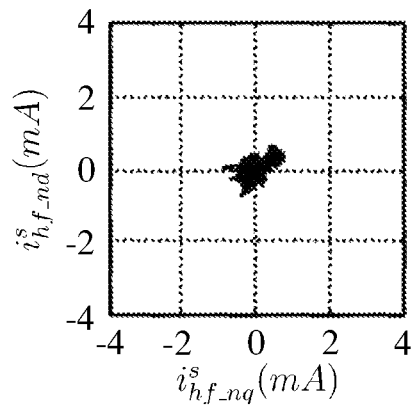
FIG. 8a is a schematic diagram of high-frequency current signal in case of no inter-turn short circuit.
Figure 8B:
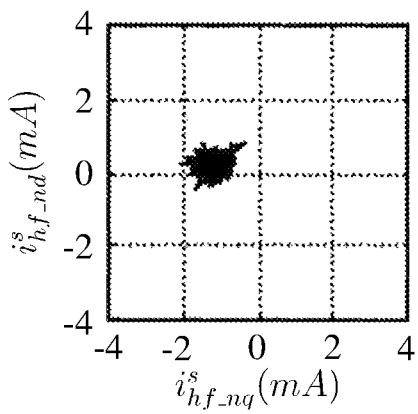
FIG. 8b is a schematic diagram of high-frequency current signal in case of the short circuit between two turns.
Figure 8C:
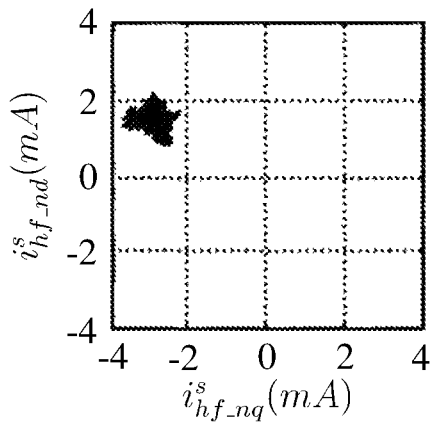
FIG. 8c is a schematic diagram of high-frequency current signal in case of the short circuit between four turns.

When the motor works normally and no short circuit fault occurs, the detected negative sequence component of the high-frequency current response is zero, as shown in FIG. 8a. In case of the inter-turn short circuit fault happened, the negative sequence component of high-frequency current response is not zero, as shown in FIG. 8b and FIG. 8c. Compared with FIG. 8b and FIG. 8c, it can be seen that when the there are a large number of short circuit turns, the short circuit fault is more serious, and the amplitude of the negative sequence component of high-frequency current response is also relatively large. Similarly, by detecting the high-frequency voltage response, the motor fault detection of the present invention can obtain the asymmetric information of equivalent model and further obtain the inter-turn fault information.

The foregoing description of the exemplary embodiments of the present invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A motor fault detection system based on coupling injection of high-frequency signal, comprising:
    a power supply;
    an inverter;
    a motor;
    a coupling circuit;
    a high-frequency detection signal source circuit;
    a response signal processing circuit and a controller,
        wherein an input end of the motor is connected with the power supply through the inverter;
    the input end of the motor is connected with the high-frequency detection signal source circuit through the coupling circuit to inject a high-frequency detection signal into a motor winding;
    an input end of the high-frequency detection signal source circuit is connected with an output end of the controller to control an output of the high-frequency detection signal;
    an output end of the response signal processing circuit is connected with an input end of the controller to send a received voltage or current response signal to the controller; and
    the controller judges whether the motor has a fault and a degree of the fault by analyzing a response signal after applying an excitation.

2. The motor fault detection system according to claim 1, wherein an input end of the response signal processing circuit can be directly connected to the power input end of the motor to obtain the motor winding voltage or current response signal; alternatively, the input end of the response signal processing circuit can be connected with the power input end of the motor through the coupling circuit to obtain the motor winding voltage or current response signal.

3. The motor fault detection system according to claim 1, wherein an output end of the inverter is connected with the input end of the motor through a high-frequency signal wave arrester.

4. The motor fault detection system according to claim 1, wherein the high-frequency signal wave arrester is composed of an inductor and a first capacitor in parallel.

5. The motor fault detection system according to claim 1, wherein the high-frequency detection signal source circuit includes a signal source chip, for generating high-frequency detection signals, and a switch tube, the gate of the switch tube is the input end, which is connected with the output end of the controller, the source of the switch tube is connected with the input end of the signal source chip through a diode, and the output end of the signal source chip is connected with the input end of the coupling circuit.

6. The motor fault detection system according to claim 1, wherein the response signal processing circuit comprises a first resistance, a second resistance and a third resistance; one end of the first, second and third resistances are grounded, and the other end thereof are connected to the input end of the motor through a second, a third, and a fourth capacitors, respectively; then, three high-frequency output ends, which are respectively led out between the first resistance and the second capacitor, between the second resistance and the third capacitor, and between the third resistance and the fifth capacitor are connected with the input end of the controller, respectively.

7. The motor fault detection system according to claim 1, wherein the controller judges whether the motor has a fault and the degree of the fault by analyzing the asymmetry, harmonic component, sudden change, fluctuation range of parameters, wherein the parameters comprise one or more of voltage, current, potential, flux, inductance, resistance, and reactance.

8. The motor fault detection system according to claim 1, wherein the controller judges whether the motor has a fault and the degree of the fault by analyzing the result of a negative sequence component of the high-frequency current signal; when an inter-turn short circuit fault occurs in the motor winding, the equivalent model of the motor winding is asymmetric, and the high-frequency current response of the stator winding is composed of a positive sequence component and the negative sequence component, which is expressed as follows:

$$i_{hf}^s = i_{hf\_p}^s + i_{hf\_n}^s$$

where $i_{hf}^s$ is a high-frequency current response of the stator winding; $i_{hf\_p}^s$ and $i_{hf\_n}^s$ are a positive sequence component and the negative sequence component of the high-frequency current response, respectively;

wherein, the negative sequence component includes the asymmetric information of the winding equivalent model, when the winding equivalent model is asymmetric, the negative sequence component is not equal to zero, that is to say, when the detected negative sequence component of the high-frequency current is not equal to zero, it is determined that the equivalent model is asymmetric, and it is further determined that an inter-turn short circuit fault has occurred in the motor winding; meanwhile, the magnitude of the negative sequence component of the high-frequency current response is in direct proportion to the degree of the fault.

* * * * *